United States Patent

Liu

[11] Patent Number: 6,075,273
[45] Date of Patent: Jun. 13, 2000

[54] INTEGRATED CIRCUIT DEVICE IN WHICH GATE OXIDE THICKNESS IS SELECTED TO CONTROL PLASMA DAMAGE DURING DEVICE FABRICATION

[75] Inventor: Chun-Ting Liu, Berkeley Heights, N.J.

[73] Assignee: Lucent Technologies Inc., Murray Hill, N.J.

[21] Appl. No.: 09/099,827

[22] Filed: Jun. 18, 1998

[51] Int. Cl.[7] .................................................. H01L 29/78
[52] U.S. Cl. .......................................... 257/392; 257/346
[58] Field of Search .................................... 257/344, 346, 257/368, 392

[56] References Cited

U.S. PATENT DOCUMENTS

| | | | |
|---|---|---|---|
| 3,731,161 | 5/1973 | Yamamoto | 257/392 |
| 5,276,344 | 1/1994 | Arima et al. | 257/346 |
| 5,495,122 | 2/1996 | Tada | 257/392 |
| 5,554,870 | 9/1996 | Fitch et al. | 257/334 |
| 5,650,651 | 7/1997 | Bui | 257/355 |

OTHER PUBLICATIONS

"Quantum–Mechanical Modeling of Electron Tunneling Current from the Inversion Layer of Ultra–Thini–Oxide nMOSFET's", by Lo, S. H. et al., *IEEE*, pp. 309–310 (May 1997).

"Evaluation and Control of Device Damage in High Density Plasma Etching" by Gadgil, P. K., et al., *J. Vac. Sci. Technol.*, B 12(1), pp. 102–111 (Jan./Feb. 1994).

*Primary Examiner*—Gene M. Munson
*Attorney, Agent, or Firm*—Richard J. Botos

[57] ABSTRACT

An integrated circuit device in which the gate oxide of the devices in the integrated circuit device is selected to control plasma damage during device processing is disclosed. The integrated circuit device has at least two transistors, each transistor having a source, drain, gate and channel. At least one device has a channel length that is greater than 0.5 $\mu$m and at least one device has a channel length that is less than 0.5 $\mu$m. The device having a channel length that is greater than 0.5 $\mu$m has a gate oxide thickness that is less than the gate oxide thickness of the device having a channel length that is less than 0.5 $\mu$m. The relative thickness of the gate oxide for the shorter channel devices and the longer channel devices is selected so that the tunneling leakage current that passes through the gate oxide for the longer channel devices is at least two orders of magnitude greater than the tunneling current through the gate oxide of the shorter channel devices.

10 Claims, 1 Drawing Sheet

INTEGRATED CIRCUIT DEVICE IN WHICH GATE OXIDE THICKNESS IS SELECTED TO CONTROL PLASMA DAMAGE DURING DEVICE FABRICATION

BACKGROUND OF THE INVENTION

1. Technical Field

The present invention relates to processes for semiconductor device fabrication that utilize a plasma environment, and integrated circuits made using such processes.

2. Art Background

Plasma processing (i.e. the use of discharge in which the ionization and fragmentation of gases takes place to produce chemically active species) is ubiquitous in processes for fabricating integrated circuits. Plasmas are used to deposit materials on and remove materials from semiconductor substrates during the device fabrication sequence.

Currently, the effects of the plasma on the materials already formed on the substrate when it is exposed to the plasma is under investigation. For example, Gadgil, P. K., et al. "Evaluation and control of device damage in high density plasma etching," *J. Vac. Sci. Technol.* B:12(1) (1994) observes that plasma exposure during plasma processing may cause stoichiometric damage to a wafer surface, resulting in device performance degradation, and decreased device yield and reliability. For example, plasma etch processes are used to form the polysilicon gate of a semiconductor device. Gadgil et al. observed that plasma processes damage the underlying gate oxide at the source and drain edges of the channel. This damage is in the form of traps or defects in the gate oxide. Gadgil et al. observed that this damage does not significantly affect the measured electron mobility of devices with a channel length of greater than 0.5 $\mu$m. However, for shorter channel devices (i.e. a channel length of less than 0.5 $\mu$m) the damaged portion of the gate oxide is a significant fraction of the channel length. Consequently, plasma-induced damage to the gate oxide of short channel devices can significantly reduce the electron mobility of these short channel devices.

Even if devices with the plasma-induced damage to the gate oxide perform initially as designed, the plasma-induced damage will speed up the aging degradation of the devices. Consequently, during device operation, some of the devices with plasma-damaged gate oxides will eventually malfunction. This aging degradation is associated with hot-carriers generated under the bias conditions of the device during operation. Since the concentration of hot carriers is greater in short-channel devices than in longer channel devices (devices having a channel length greater than 0.5 $\mu$m), aging degradation is greater in short-channel devices than in longer channel devices.

Since plasma processing -induced damage of the gate oxide adversely affects the performance of semiconductor devices having a channel length less than 0.5 $\mu$m, a process for reducing such damage is desired.

SUMMARY OF THE INVENTION

The present invention is directed to an integrated circuit which has a plurality of devices formed on a single semiconductor substrate. The integrated circuit has at least one device with a channel length that is greater than a critical dimension and at least one device that is less than or equal to a critical dimension. The devices are transistors having a source, drain, gate, and channel. The devices have a layer of dielectric material, typically a layer of silicon dioxide, underlying the gate and overlying the channel. This layer of silicon dioxide is referred to as a gate oxide.

For the purposes of the present invention, the critical dimension is the channel length that provides a ratio between the amount of gate oxide that is damaged during plasma processing and the channel length that is greater than 0.15. A channel length that provides a ratio between the amount of gate oxide that is damaged during plasma processing and the channel length that is less than 0.15 is less than the critical dimension.

In one embodiment of the present invention, at least one device has a channel length that is greater than 1 $\mu$m and at least one device has a channel length that is less than or equal to 1 $\mu$m. In a second embodiment, at least one device has a channel length that is greater than 0.5 $\mu$m and at least one device with a channel length that is less than 0.5 $\mu$m.

The gate oxide for the device having a channel length that is not a critical dimension has a first thickness and the gate oxide of the device having a channel length that is a critical dimension has a second thickness. The first thickness is less than the second thickness. The relationship between the first thickness and the second thickness is such that the leakage current through the first thickness is at least about two orders of magnitude higher through the first thickness than through the second thickness. Each short channel device is electrically connected to at least one long channel device. In one embodiment of the present invention, the shorter channel device has a channel length of 0.35 $\mu$m or less.

The present invention is also directed to a process of protecting short-channel devices from plasma-induced damage during device fabrication. In the process the channel length of the devices in an integrated circuit is first determined. The devices are then subdivided into at least two classes. A first class is a class of long channel devices which are devices with a channel length above a critical dimension. A second class is a class of short channel devices with a channel length less than a critical dimension. The first class of devices is less susceptible to significant plasma-processing induced damage than the second class.

The critical dimension is determined by the ratio of the damaged oxide channel area relative to the overall channel length. To some percentage the degree of damage is also a function of the plasma processing conditions which will likely change as plasma tools change in the future. Therefore the ratio is also dependent on the plasma processing conditions as well as the channel length. For example, if the ratio of the damaged channel area to the overall channel length is about 0.15 (fifteen percent) or less, then the channel length is greater than the critical dimension. Conversely, if the ratio of the damaged channel area to the overall channel length is shorter than about fifteen percent, then the channel length is less than the critical dimension. Specifically, assume that the plasma-induced damage is present in about 0.1 $\mu$m of the total length of the oxide. The drain junction where the electric field is the highest during device operation (and therefore sees the degradation the most) typically has a length of 0.1 $\mu$m. If the channel length of a device is 1 $\mu$m, then the ratio of the length of the damaged oxide portion to the overall channel length of the device is ten percent. Thus, 1 $\mu$m channel length devices do not have a channel length with a critical dimension. In contrast, if the channel length of a device is 0.35 $\mu$m, the ratio of the damaged oxide portion to the overall channel length of the device is thirty-five percent. Clearly a channel length of 0.35 $\mu$m is below the critical dimension.

Once devices with critical and non-critical dimensions have been identified, the present invention contemplates making the thickness of the gate dielectric layer thinner for devices with a non-critical dimension compared to the thickness of the gate dielectric layer for devices with the critical dimension. Since all of the devices having the thicker gate dielectric layer and the critical dimension are electrically coupled to at least one of the devices having the thinner gate dielectric layer and the non-critical damage, the plasma potential during gate formation and other processes is drained from the devices having the critical dimension to the thinner gate oxide of the devices with the non-critical dimension.

In another embodiment of the present invention, the selection of which devices will have a thicker gate dielectric layer and which devices will have a thinner gate dielectric layer is different. In this embodiment, devices that are not sensitive to device performance are selected to "drain" the plasma processing devices from those devices. For example, it is critical to protect the amplifiers from damage. By making the dielectric layer of the sense amplifier devices thicker than the dielectric layers of the I/O devices.

BRIEF DESCRIPTION OF THE DRAWINGS

The following drawings are provided to further illustrate examples of the present invention.

DETAILED DESCRIPTION

The integrated circuit devices of the present invention contain a plurality of discrete devices therein. Prior to fabricating the integrated circuit, at least one of the devices is identified as a device that is more susceptible to damage from plasma processing during device fabrication than at least one other device in the integrated circuit. The device or devices are identified by determining the relationship between the channel length of the device and the length of the gate dielectric layer overlying the channel that is susceptible to plasma induced damage from the formation of the polysilicon gate overlying the gate dielectric layer. Devices in which the ratio between the length of the dielectric layer overlying the channel that is susceptible to damage ($L_1$) and the length of the underlying channel ($L_2$) is higher than a certain threshold value are more susceptible to damage than devices wherein the ratio $L_1/L_2$ is below some certain value. For example in an integrated circuit device, devices with a ratio of $L_1/L_2$ that is about 0.15 or less are susceptible to less plasma induced damage to the gate dielectric layer during fabrication than devices in which the ratio of $L_1/L_2$ is greater than about 0.15.

Once the devices that are more and less susceptible to plasma induced damage are identified, the thickness of the gate dielectric layer of the devices is tailored to reduce the plasma-induced damage to the devices that are more susceptible to plasma-induced damage. Specifically the thickness of the gate dielectric layer of devices that are identified to be less susceptible to plasma-induced damage is reduced relative to the thickness of the gate dielectric layer of devices that are identified to be more susceptible to plasma-induced damage. During subsequent plasma processing steps (e.g. the plasma etch of the polysilicon gate) the damage-inducing plasma potential is siphoned from the devices with the thicker gate dielectric layers ($d_1$) to the devices with the thinner gate dielectric layers ($d_2$). However, the damage-inducing plasma potential is only siphoned to those $d_2$ devices that are electrically connected to the $d_1$ devices.

Figure 1:
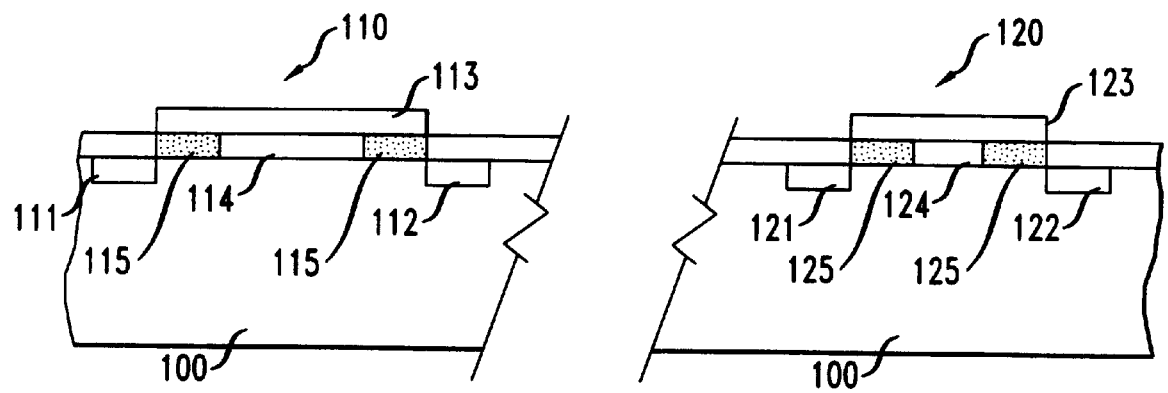
FIG. 1 is a schematic side view of two field-effect transistors formed on a single substrate, one that is more susceptible to plasma induced damage than the other.

Further explanation of the invention is provided with reference to FIG. 1. FIG. 1 illustrates two NMOS (n-channel metal-oxide-semiconductor) devices 110 and 120 formed on a single silicon substrate 100. Device 110 has a source 111, drain 112, and polysilicon gate 113. Device 120 has a source 121, drain 122, and polysilicon gate 123. Devices 110 and 120 have a gate dielectric layer 114 and 124, respectively, underlying the polysilicon gate 113 and 123 of the respective devices. Comparing device 110 with 120, the channel length (i.e. the distance between the source 111 and drain 112) of device 110 is considerably greater than the channel length of device 120.

The region of the dielectric layer 114, 124, into which high energy electrons are introduced during the plasma etch of the overlying polysilicon gate 113, 124 is illustrated as shaded regions 115 for device 110 and 125 for device 120. As illustrated in FIG. 1, the shaded region 125 is a much greater portion of the dielectric layer 124 underlying the polysilicon gate 123 in device 120 than shaded region 114 underlying polysilicon gate 113 in device 110. Thus of the devices illustrated in FIG. 1, the performance of device 120 is adversely affected by plasma induced damage but the performance of device 110 is not.

In order to control the amount of plasma induced damage to device 120, the gate dielectric layer 114 of device 110 is thinner than the gate dielectric layer 124 of device 120. Assuming that devices 110 and 120 are in the same conductive path, the potential of the plasma etch introduced into dielectric layer 123 of device 120 is drained through dielectric layer 113 of device 110. This effect reduces the damage to the device 120 if the dielectric layer 113 thickness is smaller than the dielectric layer 123.

For example, if device 110 has a channel length of 1 $\mu$m and device 120 has a channel length of 0.25 $\mu$m, and the thickness of the dielectric layer 124 in device 120 is 4 nm, it is advantageous if the thickness of the dielectric layer 114 in device 110 is 3.5 nm thick. The difference in thickness between dielectric layer 124 in device 120 and dielectric layer thickness 114 in device 110 is such that the amount of tunneling leakage current that passes through layer 114 is at least about 2 orders of magnitude greater than the amount of leakage current that passes through layer 124.

Figure 2:
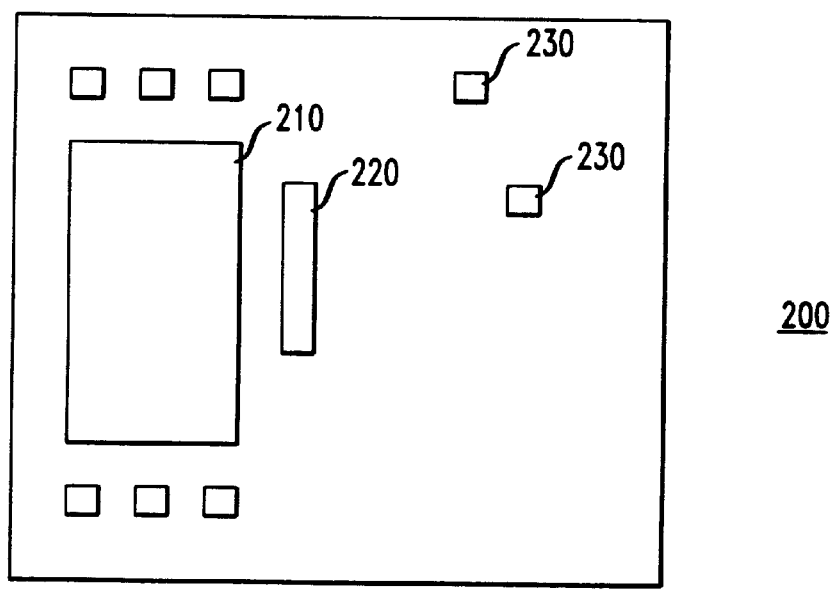
FIG. 2 is a schematic top view of an integrated circuit in which some devices have a first gate dielectric thickness and some devices have a second gate dielectric thickness.

An example of an integrated circuit device 200 of the present invention is illustrated in FIG. 2. The integrated circuit device contains an area 210 of dynamic random access memory (DRAM) devices. The integrated circuit also contains a plurality of ASIC (Application Specific Integrated Circuits) devices 220 and 230. ASIC 220 has devices with a channel length longer than 0.5 $\mu$m while ASIC 230 has devices with a channel length that is 0.5 $\mu$m or less. As the integrated circuit 200 is being fabricated, the gate dielectric layer thickness of the devices 220 and 230 is formed having a thickness of about 3.5 nm and about 4 nm, respectively. The DRAM devices have an oxide thickness of 8 nm to fulfill the refresh cycle requirement. Without the 3.5 nm thick oxide in the 220 devices, the plasma potential stored in the DRAM areas will drain through the short channel devices 230, causing damage to these devices. However, because of the presence of the devices 220 with the thinner gate oxide, the energy will drain through devices 220. Because devices 220 are longer channel devices, the devices 220 are not damaged. The devices 230 are not damaged because the plasma energy drains through the devices with the thinner oxide layer.

Fabricating an integrated circuit device that contains a plurality of devices, wherein at least two of the discrete devices among the plurality of discrete devices have gate dielectric layers of different thicknesses can be accomplished in a variety of ways. For example, the areas of the substrate in which devices with a thinner gate dielectric layer are to be formed is implanted with nitrogen. The nitrogen implant slows the oxidation rate of the silicon substrate in those regions. Thus, the thickness of the silicon dioxide dielectric layer in the nitrogen-implanted region is thinner than the thickness of the silicon dioxide layer formed in the regions of the substrate into which nitrogen was not implanted. In an alternative process, a uniform layer of silicon dioxide is formed on the surface of the substrate, and the layer is etched back in those regions where devices having the thinner gate dielectric layer are to be formed. The processing expedients used to fabricate the devices described herein are well known to one skilled in the art and are not described in detail herein.

The foregoing description was provided to illustrate the invention defined by the following claims.

What is claimed is:

1. An integrated circuit device comprising:

a plurality of first transistors and a plurality of second transistors wherein each of the plurality of first transistors is electrically interconnected to at least one of the second transistors and formed on a single substrate, each transistor having a source, drain, gate, and channel, and a layer of gate dielectric material underlying the gate and overlying the channel wherein the transistors, during formation, are subjected to at least one plasma processing step after the gate dielectric material is formed on the substrate, wherein the ratio of the length of gate dielectric material damaged plasma processing to the channel length for the first transistors is lower than the ratio of the length of gate dielectric material damaged by plasma processing to the channel length for the second transistors, wherein the channel length of the first transistors is greater than 1 $\mu$m and the channel length of the second transistors is less than or equal to 1 $\mu$m, and wherein the gate dielectric material of the first transistor is thinner than the gate dielectric material of the second transistor.

2. The integrated circuit of claim 1 wherein the thickness of the first transistor gate dielectric material and the thickness of the second transistor gate dielectric material are selected so that the amount of leakage current through the first transistor gate dielectric material is at least two orders of magnitude higher than the amount of leakage current through the second transistor gate dielectric material.

3. The integrated circuit of claim 1 wherein the gate dielectric material is silicon oxide.

4. An integrated circuit device comprising:

a plurality of first transistors and a plurality of second transistors wherein each of the first transistors is electrically interconnected to at least one of the second transistors and the transistors are formed on a single substrate, each transistor having a source, drain, gate, and channel, and a layer of gate dielectric material underlying the gate and overlying the channel wherein the transistors, during formation, are subjected to at least one plasma processing step after the gate dielectric material is formed on the substrate, wherein the ratio of the length of gate dielectric material damaged by plasma processing to the channel length for the first transistor is lower than the ratio of the length of gate dielectric material damaged by plasma processing to the channel length for the second transistor, wherein the channel length of the first transistors is greater than 0.5 $\mu$m and the channel length of the second transistors is less than or equal to 0.5 $\mu$m, and wherein the gate dielectric material of the first transistors is thinner than the gate dielectric material of the second transistors.

5. The integrated circuit device of claim 4 wherein the first transistor gate oxide thickness is about 3.5 nm and the second transistor gate oxide thickness is about 4 nm.

6. The integrated circuit of claim 4 wherein the thickness of the first transistor gate dielectric material and the thickness of the second transistor gate dielectric material are selected so that the amount of leakage current through the first transistor gate dielectric material is at least two orders of magnitude higher than the amount of leakage current through the second transistor gate dielectric material.

7. The integrated circuit of claim 4 wherein the gate dielectric material is silicon oxide.

8. An integrated circuit device comprising:

a plurality of first transistors and a plurality of second transistors and wherein each of the first transistors is electrically interconnected to at least one of the second transistors and formed on a single substrate, each transistor having a source, drain, gate, and channel, and a layer of gate dielectric material underlying the gate and overlying the channel wherein the transistors, during formation, are subjected to at least one plasma processing step after the gate dielectric material is formed on the substrate, wherein the ratio of the length of gate dielectric material damaged by plasma processing to the channel length for the first transistor is lower than the ratio of the length of gate dielectric material damaged by plasma processing to the channel length for the second transistor, wherein the channel length of the second transistor is such that the ratio of the length of gate dielectric material damaged by plasma processing to the channel length is greater than or equal to 0.15, and wherein the gate dielectric material of the first transistor is thinner than the gate dielectric material of the second transistor.

9. The integrated circuit of claim 8 wherein the thickness of the first transistor gate dielectric material and the thickness of the second transistor gate dielectric material are selected so that the amount of leakage current through the first transistor gate dielectric material is at least two orders of magnitude higher than the amount of leakage current through the second transistor gate dielectric material.

10. The integrated circuit of claim 8 wherein the gate dielectric material is silicon oxide.

* * * * *